(12) United States Patent
Gill (10) Patent No.: US 6,947,264 B2
(45) Date of Patent: Sep. 20, 2005

(54) SELF-PINNED IN-STACK BIAS STRUCTURE FOR MAGNETORESISTIVE READ HEADS

(75) Inventor: Hardayal Singh Gill, Palo Alto, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/313,070

(22) Filed: Dec. 6, 2002

(65) Prior Publication Data

US 2004/0109264 A1 Jun. 10, 2004

(51) Int. Cl.[7] ................................................. G11B 5/39
(52) U.S. Cl. .................................................. 360/324.2
(58) Field of Search ........................ 360/324.1, 324.11, 360/324.2, 324.12

(56) References Cited

U.S. PATENT DOCUMENTS

| | | | |
|---|---|---|---|
| 5,583,725 A | | 12/1996 | Coffey et al. |
| 6,023,395 A | * | 2/2000 | Dill et al. ................. 360/324.2 |
| 6,438,026 B2 | * | 8/2002 | Gillies et al. ............... 365/158 |
| 6,473,279 B2 | * | 10/2002 | Smith et al. ........... 360/324.12 |
| 6,671,139 B2 | * | 12/2003 | Carey et al. ........... 360/324.12 |
| 6,680,832 B2 | * | 1/2004 | Fontana et al. .......... 360/324.2 |
| 6,704,175 B2 | * | 3/2004 | Li et al. ................. 360/324.11 |
| 2001/0030842 A1 | * | 10/2001 | Pinarbasi ............... 360/324.11 |
| 2004/0080875 A1 | * | 4/2004 | Pinarbasi ................. 360/324.2 |

OTHER PUBLICATIONS

IBM Technical Bulletin, "Self–pinned in–stack bias structure", issue 452, p. 2131, Dec. 1, 2001.*
IBM Technical Bulletin, "In–stack bias structure using negative magnetostrictive bias layer", issue 453, p. 71, Jan. 1, 2002.*
IBM Research Disclosure, Self–Pinned Head Structure, Sep. 2001, Article No. 125, Issue No. 449, p. No. 1574.
IBM Research Disclosure, Self–Pinned In Bias Structure, Article No. 143, Issue No, 452, p. No. 2131, Dec. 1, 2001.

* cited by examiner

Primary Examiner—Angel Castro
(74) Attorney, Agent, or Firm—William D. Gill (57) ABSTRACT

A current-perpendicular-to-the plane magnetoresistive sensor with a self-pinned in-stack longitudinal bias structure is provided comprising a ferromagnetic bias layer formed of material having a negative magnetostriction coefficient and a spacer layer for antiparallel coupling to a free layer. The negative magnetostriction of the bias layer interacts with the lapping-induced stress anisotropy of the sensor stack to provide strong pinning of the magnetization of the bias layer in a direction parallel to the ABS and antiparallel to the direction of the magnetization of the free layer. Magnetostatic coupling of the bias layer magnetization with the free layer provides a longitudinal bias field to stabilize the free layer magnetization.

6 Claims, 5 Drawing Sheets

SELF-PINNED IN-STACK BIAS STRUCTURE FOR MAGNETORESISTIVE READ HEADS

BACKGROUND OF THE INVENTION

1. Field of the Invention

This invention relates in general to magnetoresistive sensors for reading information signals from a magnetic medium and, in particular to a magnetoresistive read head with a self-pinned in-stack pinned bias structure for free layer domain control.

2. Description of Related Art

Computers often include auxiliary memory storage devices having media on which data can be written and from which data can be read for later use. A direct access storage device (disk drive) incorporating rotating magnetic disks is commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive (MR) read sensors, commonly referred to as MR sensors, are the prevailing read sensors because of their capability to read data from a surface of a disk at greater track and linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which an MR element resistance varies as the square of the cosine of the angle between the magnetization in the MR element and the direction of sense current flowing through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Another type of MR sensor is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and nonmagnetic layers and within the magnetic layers.

GMR sensors using only two layers of ferromagnetic material (e.g., Ni—Fe) separated by a layer of nonmagnetic material (e.g., copper) are generally referred to as spin valve (SV) sensors manifesting the SV effect.

Figure 1:
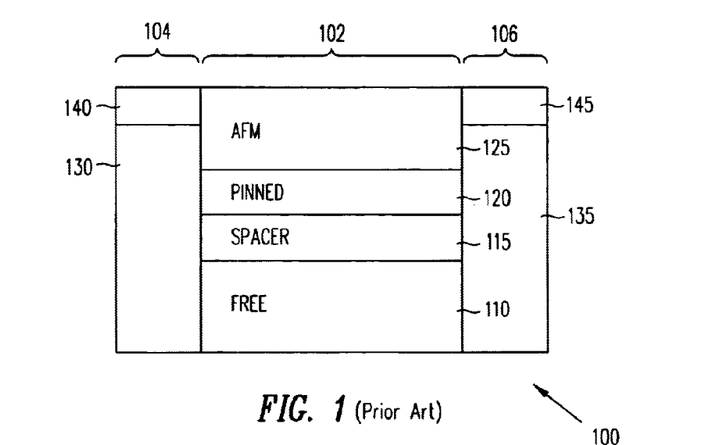
FIG. 1 is an air bearing surface view, not to scale, of a spin valve sensor.

FIG. 1 shows an SV sensor 100 comprising end regions 104 and 106 separated by a central region 102. A first ferromagnetic layer, referred to as a pinned layer 120, has its magnetization typically fixed (pinned) by exchange coupling with an antiferromagnetic (AFM) layer 125. The magnetization of a second ferromagnetic layer, referred to as a free layer 110, is not fixed and is free to rotate in response to the magnetic field from the recorded magnetic medium (the signal field). The free layer 110 is separated from the pinned layer 120 by a nonmagnetic, electrically conducting spacer layer 115. Hard bias layers 130 and 135 formed in the end regions 104 and 106, respectively, provide longitudinal bias for the free layer 110. Leads 140 and 145 formed on hard bias layers 130 and 135, respectively, provide electrical connections for sensing the resistance of SV sensor 100. In the SV sensor 100, because the sense current flow between the leads 140 and 145 is in the plane of the SV sensor layers, the sensor is known as a current-in-plane (CIP) SV sensor. IBM's U.S. Pat. No. 5,206,590 granted to Dieny et al. discloses a GMR sensor operating on the basis of the SV effect.

Another type of spin valve sensor is an antiparallel pinned (AP) spin valve sensor. The AP-pinned spin valve sensor differs from the simple spin valve sensor in that an AP-pinned structure has multiple thin film layers instead of a single pinned layer. The AP-pinned structure has an antiparallel coupling (APC) layer sandwiched between first and second ferromagnetic pinned layers. The first pinned layer has its magnetization oriented in a first direction by exchange coupling to the antiferromagnetic pinning layer. The second pinned layer is immediately adjacent to the free layer and is antiparallel exchange coupled with the first pinned layer because of the selected thickness (in the order of 8 (E) of the APC layer between the first and second pinned layers. Accordingly, the magnetization of the second pinned layer is oriented in a second direction that is antiparallel to the direction of the magnetization of the first pinned layer.

The AP-pinned structure is preferred over the single pinned layer because the magnetizations of the first and second pinned layers of the AP-pinned structure subtractively combine to provide a net magnetization that is less than the magnetization of the single pinned layer. The direction of the net magnetization is determined by the thicker of the first and second pinned layers. A reduced net magnetization equates to a reduced demagnetization field from the AP-pinned structure. Since the antiferromagnetic exchange coupling is inversely proportional to the net pinning magnetization, this increases exchange coupling between the first pinned layer and the antiferromagnetic pinning layer. An AP-pinned spin valve sensor is described in commonly assigned U.S. Pat. No. 5,465,185 to Heim and Parkin.

Another type of magnetic device currently under development is a magnetic tunnel junction (MTJ) device. The MTJ device has potential applications as a memory cell and as a magnetic field sensor. The MTJ device comprises two ferromagnetic layers separated by a thin, electrically insulating, tunnel barrier layer. The tunnel barrier layer is sufficiently thin that quantum-mechanical tunneling of charge carriers occurs between the ferromagnetic layers. The tunneling process is electron spin dependent, which means that the tunneling current across the junction depends on the spin-dependent electronic properties of the ferromagnetic materials and is a function of the relative orientation of the magnetic moments, or magnetization directions, of the two ferromagnetic layers. In the MTJ sensor, one ferromagnetic layer has its magnetic moment fixed, or pinned, and the other ferromagnetic layer has its magnetic moment free to rotate in response to an external magnetic field from the recording medium (the signal field). When an electric potential is applied between the two ferromagnetic layers, the sensor resistance is a function of the tunneling current across the insulating layer between the ferromagnetic layers. Since the tunneling current that flows perpendicularly through the tunnel barrier layer depends on the relative magnetization directions of the two ferromagnetic layers, recorded data can be read from a magnetic medium because the signal field causes a change of direction of magnetization of the free layer, which in turn causes a change in resistance of the MTJ sensor and a corresponding change in the sensed current or voltage. IBM's U.S. Pat. No. 5,650,958 granted to Gallagher et al describes a MTJ sensor operating on the basis of the magnetic tunnel junction effect.

Two types of current-perpendicular-to-plane (CPP) sensors have been extensively explored for magnetic recording at ultrahigh densities (>20 Gb/in$^2$). One is a GMR spin valve sensor and the other is a MTJ sensor. When the CPP sensor is used, magnetic stabilization of the free (sense) layer using hard bias layers in the end regions to provide longitudinal bias can be difficult due to the need for insulating layers to avoid current shorting around the active region of the sensor. Therefore, there is a continuing need to improve the magnetic stabilization of CPP type magnetoresistive sensors to improve sensor stability.

SUMMARY OF THE INVENTION

It is an object of the present invention to disclose current-perpendicular-to-plane (CPP) magnetic tunnel junction (MTJ) and spin valve (SV) sensors having a self-pinned longitudinal bias stack for in-stack biasing to stabilize the free layer.

It is another object of the present invention to disclose CPP MTJ and SV sensors having an in-stack longitudinal bias layer formed of material having negative magnetoresistance.

It is a further object of the present invention to disclose CPP MTJ and SV sensors having an in-stack longitudinal bias layer in which the magnetostatic bias field from the bias layer adds to the coupling field between the free layer and the bias stack.

In accordance with the principles of the present invention, there is disclosed an embodiment of the invention wherein a CPP MTJ sensor comprises a MTJ stack and a longitudinal bias stack adjacent to and in contact with a free (sense) layer of the MTJ stack. The bias stack comprises a bias layer of ferromagnetic material having a negative magnetostriction coefficient and a spacer layer of copper (Cu), ruthenium (Ru) or tantalum (Ta) sandwiched between the bias layer and the free layer of the MTJ stack. The bias layer preferably has a thickness in the range of 1.5–2 times the thickness of the free layer to provide a strong magnetic bias field which is proportional to bias layer thickness. A spacer layer of Cu or Ru is preferred because negative coupling of the bias layer and the free layer is possible with these materials ensuring that the magnetostatically coupled bias field adds to the exchange coupling field in providing stability to the free layer.

The total uniaxial anisotropy field, $H_K$, of ferromagnetic materials is the sum of the intrinsic uniaxial anisotropy field, $H_k$, and the stress induced uniaxial anisotropy field, $H_\sigma$. The intrinsic uniaxial anisotropy field, $H_k$, often simply referred to as the uniaxial anisotropy field, is normally controlled by application of a magnetic field during film growth, or by other conditions of film deposition. The stress induced uniaxial anisotropy field, $H_\sigma$, is proportional to the product of the magnetostriction coefficient, $\lambda$, of the ferromagnetic material and the tensile or compressive stress, $\sigma$, applied to the material. SV sensors formed on $Al_2O_3$ substrates are generally under compressive stress in the plane of the ABS, so that use of materials having high negative magnetostriction coefficients will result in the high values of $H_\sigma$ parallel to the ABS desired for strong self-pinning of the bias layer of the present invention.

In the present invention, materials for the bias layer having high values of negative saturation magnetostriction ($\lambda_S$) and high intrinsic uniaxial anisotropy ($H_k$) are preferred. For the present purposes, high saturation magnetostriction is defined as $\lambda_S \leq -5 \times 10^{-6}$ and high intrinsic uniaxial anisotropy is defined as $H_k \geq 10$ Oe.

The above, as well as additional objects, features, and advantages of the present invention will become apparent in the following detailed written description.

BRIEF DESCRIPTION OF THE DRAWINGS

For a fuller understanding of the nature and advantages of the present invention, as well as the preferred mode of use, reference should be made to the following detailed description read in conjunction with the accompanying drawings. In the following drawings, like reference numerals designate like or similar parts throughout the drawings.

DETAILED DESCRIPTION OF THE PREFERRED EMBODIMENT

The following description is the best embodiment presently contemplated for carrying out the present invention. This description is made for the purpose of illustrating the general principles of the present invention and is not meant to limit the inventive concepts claimed herein.

Figure 2:
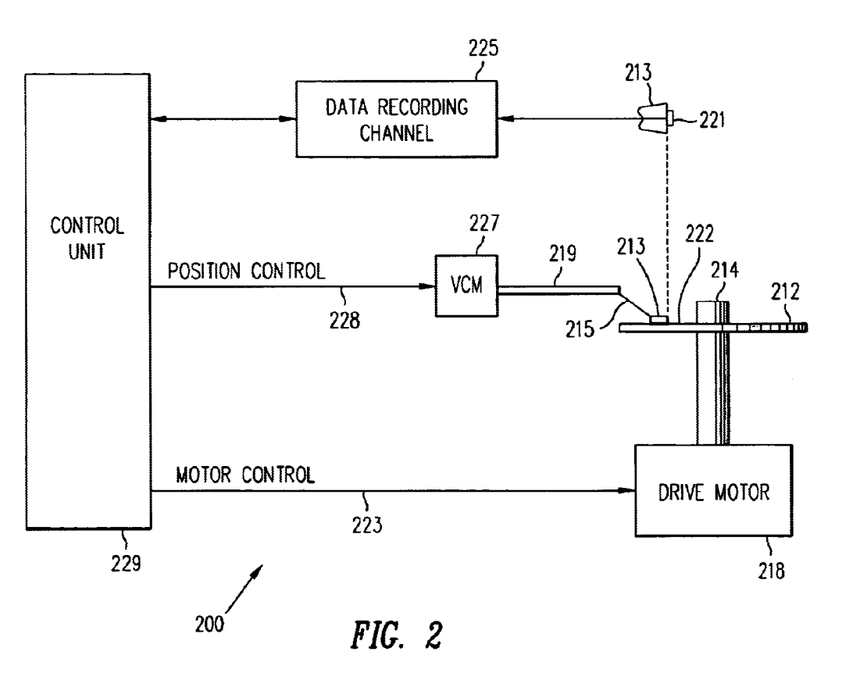
FIG. 2 is a simplified drawing of a magnetic recording disk drive system.

Referring now to FIG. 2, there is shown a disk drive 200 embodying the present invention. As shown in FIG. 2, at least one rotatable magnetic disk 212 is supported on a spindle 214 and rotated by a disk drive motor 218. The magnetic recording media on each disk is in the form of an annular pattern of concentric data tracks (not shown) on the disk 212.

At least one slider 213 is positioned on the disk 212, each slider 213 supporting one or more magnetic read/write heads 221 where the head 221 incorporates the read sensor of the present invention. As the disks rotate, the slider 213 is moved radially in and out over the disk surface 222 so that the heads 221 may access different portions of the disk where desired data is recorded. Each slider 213 is attached to an actuator arm 219 by means of a suspension 215. The suspension 215 provides a slight spring force which biases the slider 213 against the disk surface 222. Each actuator arm 219 is attached to an actuator 227. The actuator as shown in FIG. 2 may be a voice coil motor (VCM). The VCM comprises a coil movable within a fixed magnetic field, the direction and speed of the coil movements being controlled by the motor current signals supplied by a controller 229.

During operation of the disk storage system, the rotation of the disk 212 generates an air bearing between the slider 213 (the surface of the slider 213 which includes the head 321 and faces the surface of the disk 212 is referred to as an air bearing surface (ABS)) and the disk surface 222 which exerts an upward force or lift on the slider. The air bearing thus counterbalances the slight spring force of the suspension 215 and supports the slider 213 off and slightly above the disk surface by a small, substantially constant spacing during normal operation.

The various components of the disk storage system are controlled in operation by control signals generated by the control unit 229, such as access control signals and internal clock signals. Typically, the control unit 229 comprises logic control circuits, storage chips and a microprocessor. The control unit 229 generates control signals to control various system operations such as drive motor control signals on line 223 and head position and seek control signals on line 228. The control signals on line 228 provide the desired current profiles to optimally move and position the slider 213 to the desired data track on the disk 212. Read and write signals are communicated to and from the read/write heads 221 by means of the recording channel 225. Recording channel 225 may be a partial response maximum likelihood (PMRL) channel or a peak detect channel. The design and implementation of both channels are well known in the art and to persons skilled in the art. In the preferred embodiment, recording channel 225 is a PMRL channel.

The above description of a typical magnetic disk storage system, and the accompanying illustration of FIG. 2 are for representation purposes only. It should be apparent that disk storage systems may contain a large number of disks and actuator arms, and each actuator arm may support a number of sliders.

Figure 3:
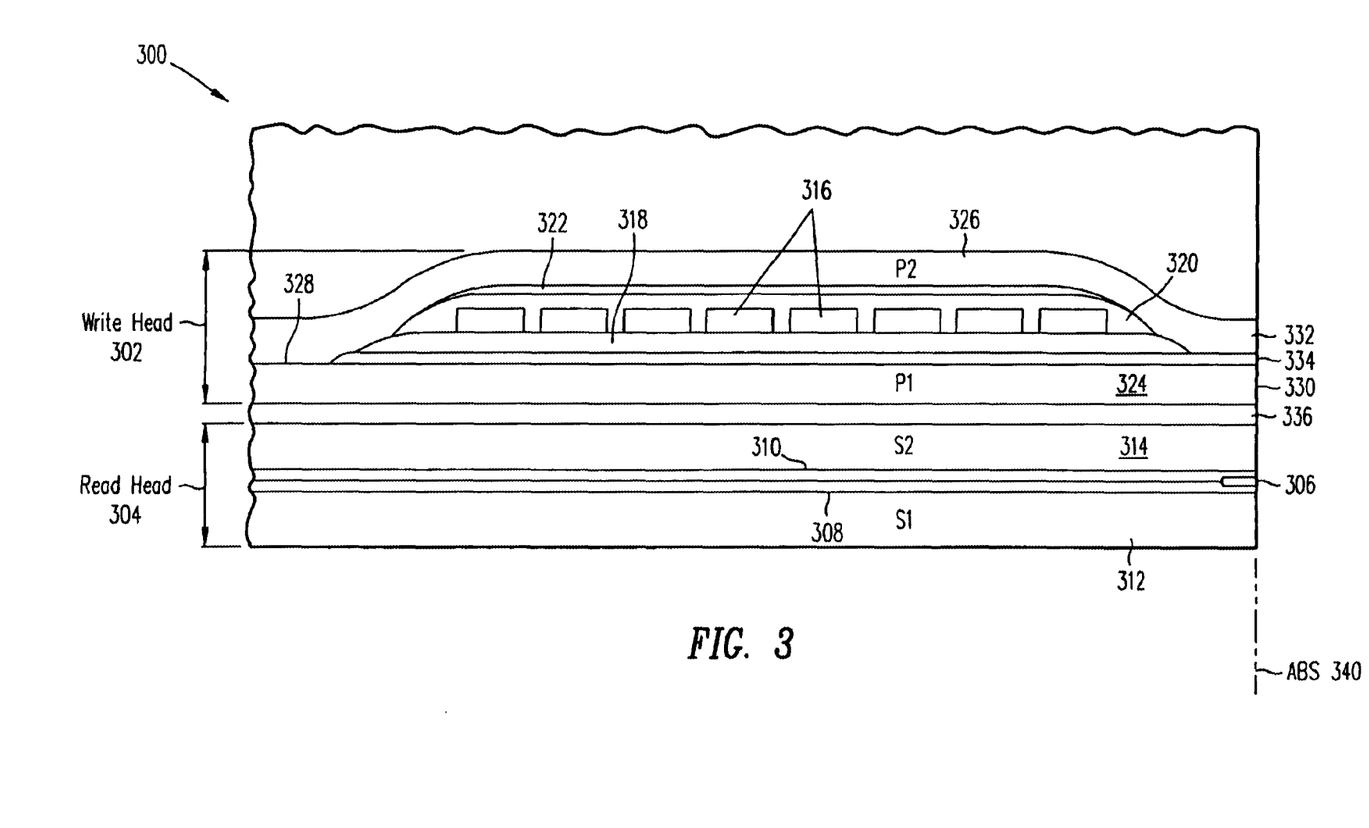
FIG. 3 is a vertical cross-section view, not to scale, of a "piggyback" read/write magnetic head.

FIG. 3 is a side cross-sectional elevation view of a "piggyback" magnetic read/write head 300, which includes a write head portion 302 and a read head portion 304, the read head portion employing a read sensor 306 according to the present invention. The sensor 306 is sandwiched between nonmagnetic insulative first and second read gap layers 308 and 310, and the read gap layers are sandwiched between ferromagnetic first and second shield layers 312 and 314. In response to external magnetic fields, the resistance of the sensor 306 changes. A sense current $I_S$ conducted through the sensor causes these resistance changes to be manifested as potential changes. These potential changes are then processed as readback signals by the processing circuitry of the data recording channel 246 shown in FIG. 2.

The write head portion 302 of the magnetic read/write head 300 includes a coil layer 316 sandwiched between first and second insulation layers 318 and 320. A third insulation layer 322 may be employed for planarizing the head to eliminate ripples in the second insulation layer 320 caused by the coil layer 316. The first, second and third insulation layers are referred to in the art as an insulation stack. The coil layer 316 and the first, second and third insulation layers 38, 320 and 322 are sandwiched between first and second pole piece layers 324 and 326. The first and second pole piece layers 324 and 326 are magnetically coupled at a back gap 328 and have first and second pole tips 330 and 332 which are separated by a write gap layer 334 at the ABS 340. An insulation layer 336 is located between the second shield layer 314 and the first pole piece layer 324. Since the second shield layer 314 and the first pole piece layer 324 are separate layers this read/write head is known as a "piggyback" head.

Figure 4:
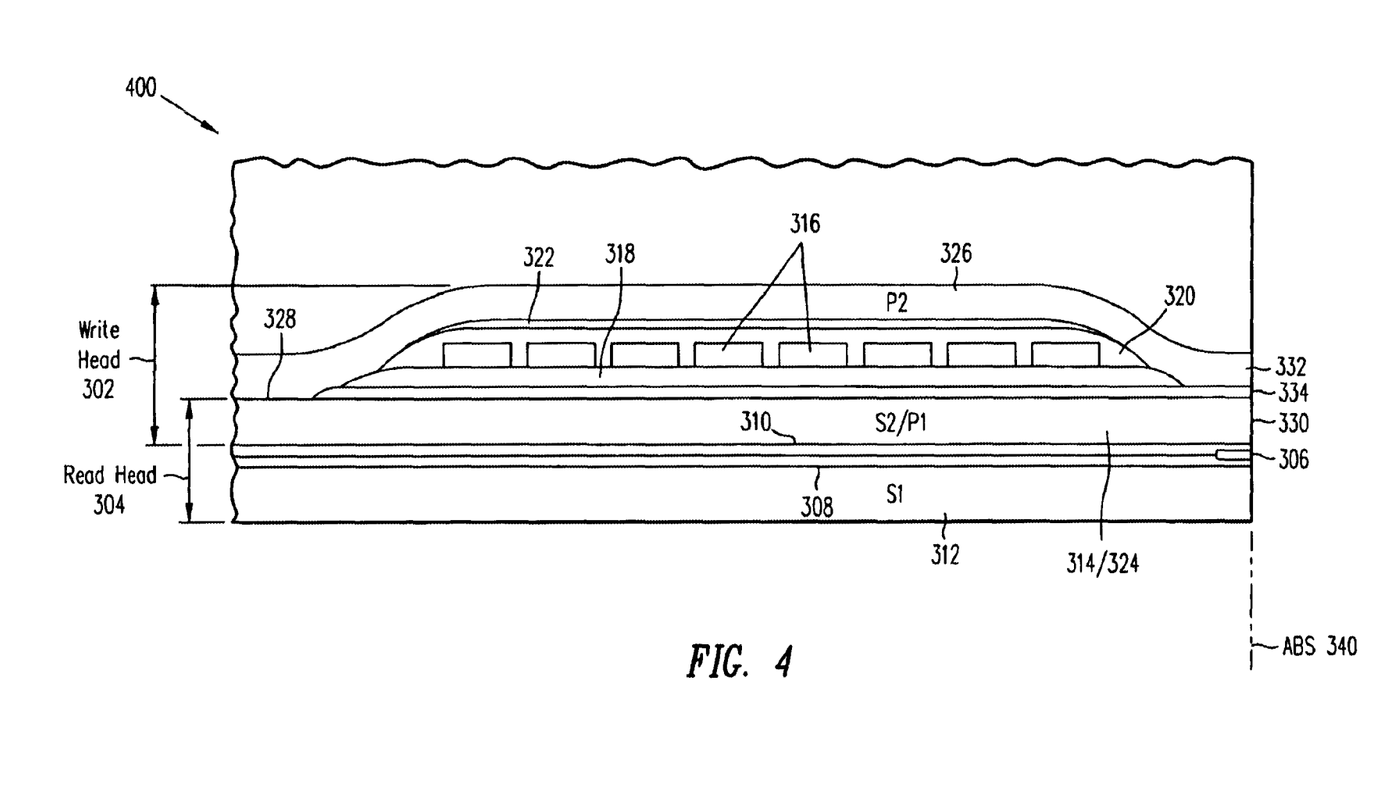
FIG. 4 is a vertical cross-section view, not to scale, of a "merged" read/write magnetic head.

FIG. 4 is the same as FIG. 3 except the second shield layer 414 and the first pole piece layer 424 are a common layer. This type of read/write head is known as a "merged" head 400. The insulation layer 336 of the piggyback head in FIG. 3 is omitted in the merged head 400 of FIG. 4.

FIRST EXAMPLE

Figure 5:
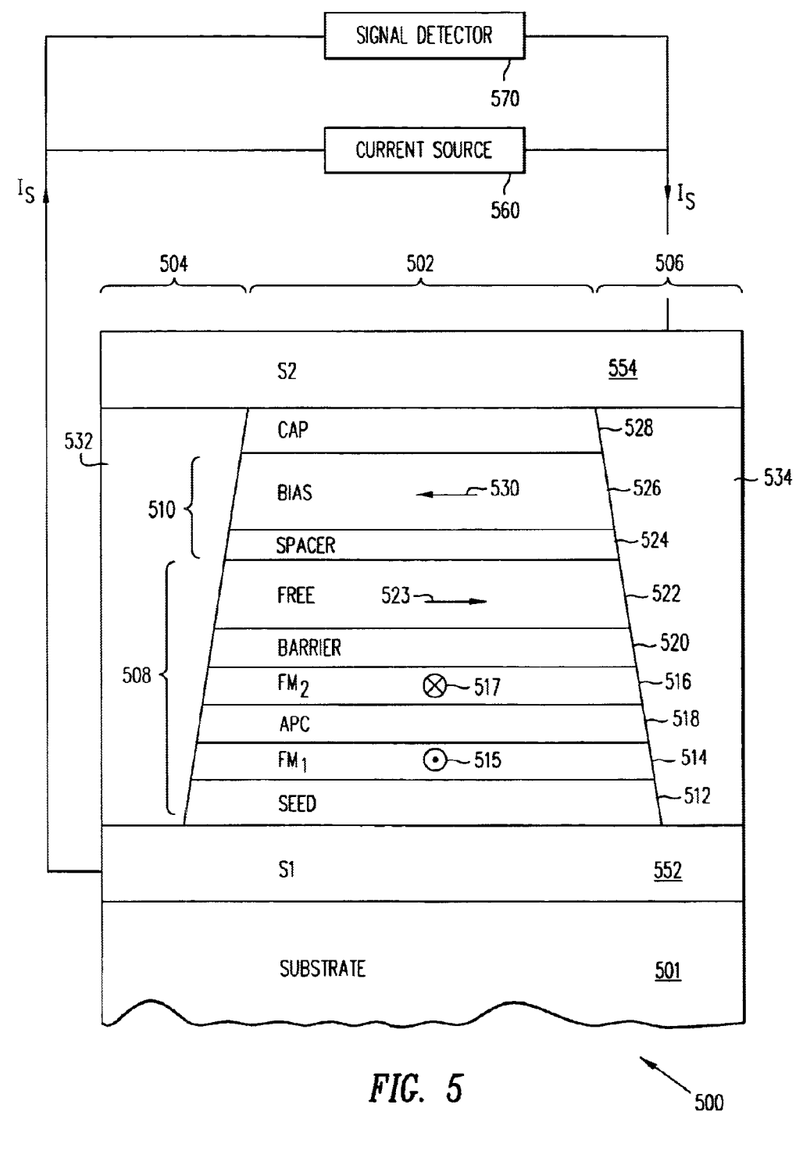
FIG. 5 is an air bearing surface view, not to scale, of a CPP magnetic tunnel junction embodiment of the present invention.

FIG. 5 depicts an air bearing surface (ABS) view, not to scale, of a MTJ sensor 500 having a self-pinned in-stack bias layer according to a first embodiment of the present invention. The MTJ sensor 500 comprises end regions 504 and 506 separated from each other by a central region 502. The substrate can be any suitable substrate including glass, semiconductor material, or a ceramic material such as alumina ($Al_2O_3$). The active region of the MTJ sensor comprises a MTJ stack 508 and a longitudinal bias stack 510 formed in the central region 502. The seed layer 512 is a layer deposited to modify the crystallographic texture or grain size of the subsequent layers. The MTJ stack 508 sequentially deposited over the seed layer comprises a first ferromagnetic layer (FM1) 514, an antiparallel coupling (APC) layer 518, a second ferromagnetic layer (FM2) 516, a tunnel barrier layer 520 and a ferromagnetic free layer 522. The APC layer 518 is formed of a nonmagnetic material, preferably ruthenium (Ru), that allows the FM1 and FM2 layers 514 and 516 to be strongly coupled together antiferromagnetically forming a self-pinned AP-pinned layer. The magnetizations of the FM1 layer 514 and the FM2 layer 516 are pinned in directions perpendicular to the ABS as indicated by arrow point 515 and arrow tail 517 pointing into and out of the plane of the paper, respectively. The magnetization of the free layer 522 indicated by the arrow 523 is oriented in the plane of the free layer and parallel to the ABS in the absence of an external (signal) field. The magnetization 523 is free to rotate in the presence of an external field.

The longitudinal bias stack 510 sequentially deposited over the MTJ stack 508 comprises a spacer layer 524 and a ferromagnetic bias layer 526. The self-pinned bias layer 526 is formed of material having a high total uniaxial anisotropy $H_K$ given by the sum of the intrinsic uniaxial anisotropy $H_k$ and the stress-induced uniaxial anisotropy $H_\sigma$. The total uniaxial anisotropy should be be in the plane of the pinned layer and parallel to the ABS. The desired stress-induced uniaxial anisotropy of the bias layer is provided by making the bias layer 526 of a material having a negative magnetostriction coefficient that interacts with the lapping-induced stress anisotropy of the sensor stack to provide strong pinning of the magnetization 530 in a direction parallel to the ABS and antiparallel to the direction of the magnetization 523 of the free layer 522. The spacer layer 524 is formed of a nonmagnetic material, preferably copper (Cu) or ruthenium (Ru) which allow negative coupling between the bias layer and the free layer. The bias layer 526 preferably has a thickness in the range of 1.5–2 times the thickness of the free layer 522 in order to provide the desired magnitude of bias field to stabilize the free layer single magnetic domain structure. Since the magnetic anisotropy energy of the bias layer is proportional to volume, and therefore thickness of the layer, having a thick bias layer 526 has the advantage of increasing the pinning of the bias layer as well as enhancing coupling to the free layer in contrast to the case for an exchange pinned bias layer where pinning is interfacial in nature and therefore varies inversely with thickness of the bias layer. A cap layer 528 formed on the bias layer 526 completes the central portion 502 of the sensor. End region layers 532 and 534 abutting the MTJ sensor layers are formed of electrically resistive material such as alumina.

First and second shield layers 552 and 554 adjacent to the seed layer 512 and the cap layer 528, respectively, provide electrical connections for the flow of a sensing current $I_S$ from a current source 560 to the MTJ sensor 500. A signal detector 570 which is electrically connected to first and second shields 552 and 554 senses the change in resistance due to changes induced in the free layer 523 by the external magnetic field from the disk. The external field acts to rotate the direction of magnetization of the free layer 523 relative to the direction of magnetization of the pinned second ferromagnetic layer 516 which is preferably pinned perpendicular to the ABS. The signal detector 570 preferably comprises a partial response maximum likelihood (PRML) recording channel for processing the signal detected by MTJ sensor 500. Alternatively, a peak detect channel or maximum likelihood channel (e.g., 1,7 ML) may be used. The design and implementation of the aforementioned channels are known to those skilled in the art. The signal detector 570 also includes other circuitries such as a preamplifier (electrically placed between the sensor and the channel) for conditioning the sensed resistance changes as is known to those skilled in the art.

The MTJ sensor 500 is fabricated in a magnetron sputtering or an ion beam sputtering system to sequentially deposit the multilayer structure shown in FIG. 5. The sputter deposition process is carried out in the presence of a longitudinal magnetic field of about 40 Oe to orient the easy axis of all the ferromagnetic layers. The first shield layer 552 formed of Ni—Fe having a thickness in the range of 5000–10000 Å is deposited on a substrate 501. The seed layer 512 formed of Pt—Mn having a thickness in the range of 4–150 Å is deposited over the first shield layer 552. The MTJ stack 508 is formed on the seed layer by sequentially depositing the FM1 layer 514 of Co—Fe having a thickness of about 10 Å, the APC layer 518 of ruthenium (Ru) having a thickness of about 8 Å, the FM2 layer 516 of Co—Fe having a thickness of about 19 Å, the barrier layer 520 of $Al_2O_3$ formed by depositing and then plasma oxidizing, or alternatively naturally oxidizing a 3–20 Å aluminum (Al) layer, and the free layer 522 of Ni—Fe having a thickness of about 30 Å. The bias stack 510 is deposited over the MTJ stack 508 by sequentially depositing the spacer layer 524 of copper (Cu), or alternatively ruthenium (Ru), having a thickness in the range of 5–20 Å and the bias layer 526 of $Ni_{90}$—$Fe_{10}$ or $Co_{90}$—$Nb_{10}$, or alter another ferromagnetic material having negative magnetostriction, having a thickness in the range of 30–60 Å over the free layer 522. The cap layer 528 of tantalum (Ta) having a thickness of about 50 Å is deposited over the bias layer 526.

The second shield layer 554 formed of Ni—Fe having a thickness in the range of 5000–10000 Å is deposited over the cap layer 528. Insulating end region layers 532 and 534 formed of $Al_2O_3$ deposited between the first shield layer 552 and the second shield layer 554 in the end regions 504 and 506 provide electrical insulation between the shields/leads and prevent shunting of the sense current $I_S$ around the active region 502 of the MTJ sensor.

Self-pinning of the magnetization of the bias layer 526 using stress anisotropy of the MTJ sensor after lapping together with negative magnetostriction of the material forming the bias layer is calculated to be significantly stronger than pinning by an antiferromagnetic layer exchange coupled to the bias layer. Stress anisotropy modeling of a sensor stack leads to an estimated anisotropic stress, σ, of about $-5\times10^9$ dynes/cm² (–500 Mps). The negative stress anisotropy indicates a compressive stress in the plane parallel to the ABS. The magnetostriction coefficient, λ, for the material forming the bias layer is about $-5\times10^{-5}$. The stress-induced uniaxial anisotropy field $H_\sigma$ may be calculated using the following equation known to the art:

$$H_\sigma = 3(\lambda/M)\sigma,$$

where λ is the magnetostriction coefficient,
σ is the anisotropic stress, and
M is the magnetization.

Using a value of the saturation magnetization of about 1000 emu/cm³ for the bias layer materials $Ni_{90}$—$Fe_{10}$ or $Co_{90}$—$Nb_{10}$ in the above equation leads to a value of $H_\sigma=750$ Oe for the stress-induced uniaxial anisotropy field available for self-pinning of the bias layer. This field is very strong in comparison to the pinning field of about 300 Oe provided by an AFM layer of Pt—Mn for a 30 Å thick ferromagnetic bias layer or about 150 Oe for a 60 Å thick ferromagnetic bias layer.

When the spacer layer 524 material and thickness is chosen to provide negative coupling between the bias layer 526 and the free layer 522, the longitudinal bias field at the free layer due to the magnetostatic coupling of the bias layer magnetization 530 to the free layer is further enhanced by the contribution due to the AP-coupling of the magnetization 530 to the free layer.

SECOND EXAMPLE

Figure 6:
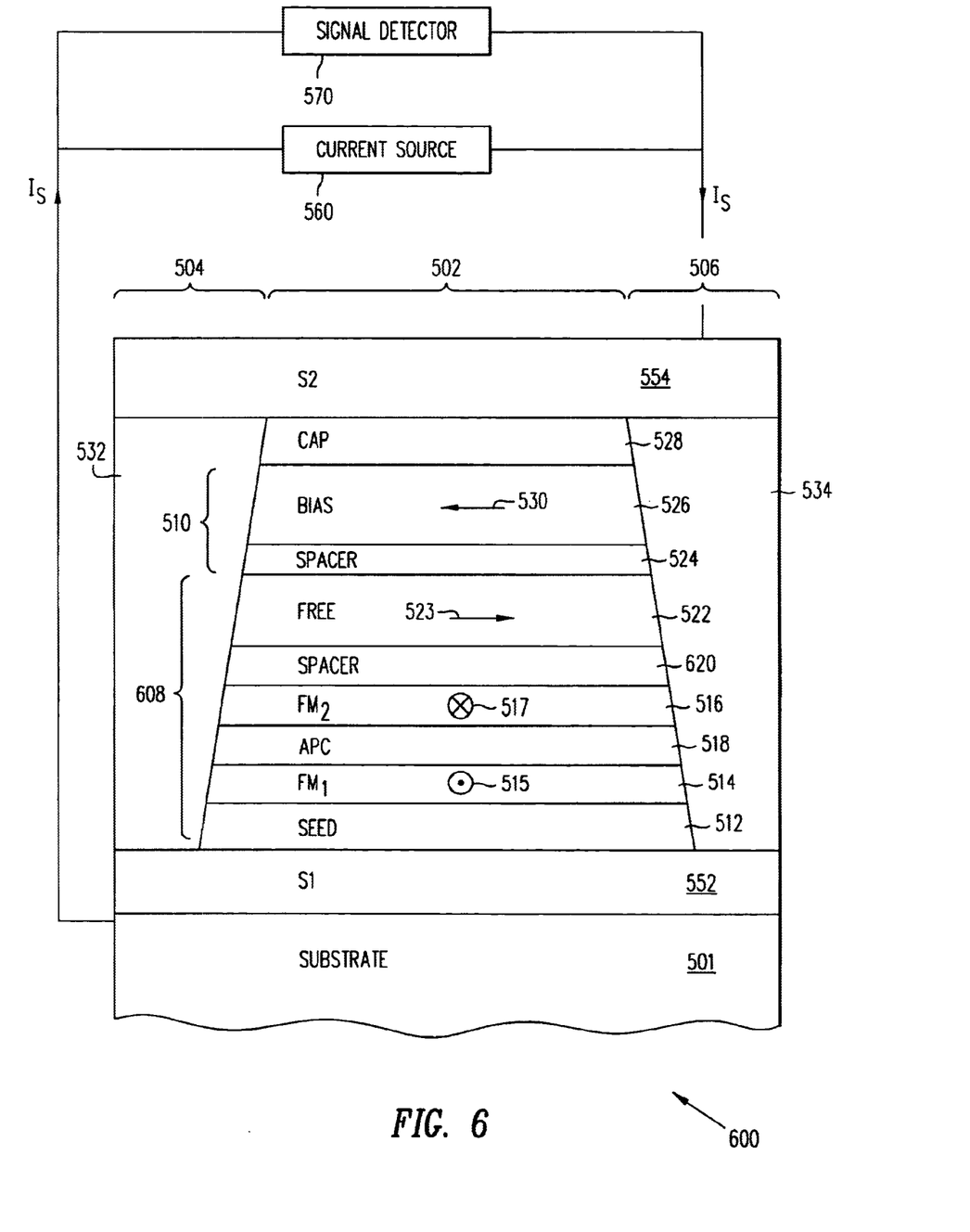
FIG. 6 is an air bearing surface view, not to scale, of a CPP spin valve embodiment of the present invention.

FIG. 6 shows an air bearing surface view (ABS) view, not to scale, of a CPP spin valve (SV) sensor 600 according to a second embodiment of the present invention. The SV sensor 600 differs from the MTJ sensor 500 depicted in FIG. 5 in having a CPP SV stack 608 in place of the MTJ stack 508. The active region of the SV sensor comprises the SV stack 608 and the longitudinal bias stack 510 formed in the central region 502. The SV stack 608 sequentially deposited over the seed layer 512 comprises a first ferromagnetic layer (FM1) 514, an antiparallel coupling (APC) layer 518, a second ferromagnetic layer (FM2) 516, a conductive spacer layer 620 and a ferromagnetic free layer 522. The conductive spacer layer 620, preferably formed of copper having a thickness of about 20 Å, replaces the insulating tunnel barrier layer 520 of the MTJ sensor 500 of the first example. The APC layer 518 is formed of a nonmagnetic material, preferably ruthenium (Ru), that allows the FM1 and FM2 layers 514 and 516 to be strongly coupled together antiferromagnetically forming a self-pinned AP-pinned layer. The magnetizations of the FM1 layer 514 and the FM2 layer 516 are pinned in directions perpendicular to the ABS as indicated by arrow point 515 and arrow tail 517 pointing into and out of the plane of the paper, respectively. The magnetization of the free layer 522 indicated by the arrow 523 is oriented in the plane of the free layer and parallel to the ABS in the absence of an external (signal) field. The magnetization 523 is free to rotate in the presence of an external field. The longitudinal bias stack 510 sequentially deposited over the SV stack 608 has the same structure as the bias stack of the first example. The self-pinned bias layer 526 preferably has a thickness in the range of 1.5–2 times the thickness of the free layer 522 in order to provide the desired magnitude of bias field to stabilize the free layer single magnetic domain structure.

The SV sensor 600 is fabricated in a magnetron sputtering or an ion beam sputtering system to sequentially deposit the multilayer structure shown in FIG. 6. The sputter deposition process is the same as that used to fabricate the MTJ sensor 500 except for deposition of the conductive spacer laye 620 in place of the insulating tunnel barrier layer 520. The spacer layer of copper (Cu) having a thickness of 20 Å is deposited on the pinned FM2 layer 516. The free layer 522 is then deposited on the spacer layer 620.

Longitudinal biasing of the free layer 522 by the self-pinned bias layer 526 is the same as described herein above with reference to the first example and will not be repeated in the interest of brevity.

It should be understood that the self-pinned in-stack bias layer of the present invention may be used with any MTJ sensor or SV sensor. In particular, the self-pinned in-stack bias layer may be used with AFM pinning simple pinned or AP-pinned MTJ sensors and SV sensors.

While the present invention has been particularly shown and described with reference to the preferred embodiments, it will be understood to those skilled in the art that various changes in form and detail may be made without departing from the spirit, scope and teaching of the invention. Accordingly, the disclosed invention is to be considered merely as illustrative and limited only as specified in the appended claims.

I claim:

1. A magnetoresistive tunnel junction (MTJ) sensor, comprising:
   a pinned layer;
   a ferromagnetic free layer;
   a tunnel barrier layer sandwiched between said pinned layer and said free layer;
   a ferromagnetic bias layer, said bias layer having a high uniaxial anisotropy caused by stressing said bias layer, wherein the ferromagnetic bias layer has a thickness in the range of 1.5–2 times the thickness of the free layer; and
   a spacer layer sandwiched between said free layer and said bias layer.

2. A spin valve (SV) sensor, comprising:
   a pinned layer;
   a ferromagnetic free layer;
   a first spacer layer sandwiched between said pinned layer and said free layer;
   a ferromagnetic bias layer, said bias layer having a high uniaxial anisotropy caused by stressing said bias layer, wherein the ferromagnetic bias layer has a thickness in the range of 1.5–2 times the thickness of the free layer; and
   a second spacer layer sandwiched between said free layer and said bias layer.

3. A magnetic read/write head comprising:
   a write head including:
      at least one coil layer and an insulation stack, the coil layer being embedded in the insulation stack;
      first and second pole piece layers connected at a back gap and having pole tips with edges forming a portion of an air bearing surface (ABS);
      the insulation stack being sandwiched between the first and second pole piece layers; and
      a write gap layer sandwiched between the pole tips of the first and second pole piece layers and forming a portion of the ABS;
   a read head including:
      a magnetic tunnel junction (MTJ) sensor, the MTJ sensor being sandwiched between first and second shield layers, the MTJ sensor comprising:
         a pinned layer;
         a ferromagnetic free layer;
         a tunnel barrier layer sandwiched between said pinned layer and said free layer;
         a ferromagnetic bias layer, said bias layer having a high uniaxial anisotropy caused by stressing said bias layer, wherein the ferromagnetic bias layer has a thickness in the range of 1.5–2 times the thickness of the free layer; and
         a spacer layer sandwiched between said free layer and said bias layer; and
      an insulation layer disposed between the second shield layer of the read head and the first pole piece layer of the write head.

4. A magnetic read/write head comprising:
   a write head including:
      at least one coil layer and an insulation stack, the coil layer being embedded in the insulation stack;
      first and second pole piece layers connected at a back gap and having pole tips with edges forming a portion of an air bearing surface (ABS);
      the insulation stack being sandwiched between the first and second pole piece layers; and
      a write gap layer sandwiched between the pole tips of the first and second pole piece layers and forming a portion of the ABS;
   a read head including:
      a spin valve (SV) sensor, the SV sensor being sandwiched between first and second shield layers, the SV sensor comprising:
         a pinned layer;
         a ferromagnetic free layer;
         a first spacer layer sandwiched between said pinned layer and said free layer;
         a ferromagnetic bias layer, said bias layer having a high uniaxial anisotropy caused by stressing said bias layer, wherein the ferromagnetic bias layer has a thickness in the range of 1.5–2 times the thickness of the free layer; and
         a second spacer layer sandwiched between said free layer and said bias layer; and
      an insulation layer disposed between the second shield layer of the read head and the first pole piece layer of the write head.

5. A disk drive system comprising:
   a magnetic recording disk;
   a magnetic read/write head for magnetically recording data on the magnetic recording disk and for sensing magnetically recorded data on the magnetic recording disk, said magnetic read/write head comprising;
      a write head including:
         at least one coil layer and an insulation stack, the coil layer being embedded in the insulation stack;
         first and second pole piece layers connected at a back up and having pole tips with edges forming a portion of an air bearing surface (ABS);
         the insulation stack being sandwiched between the first and second pole piece layers; and
         a write gap layer sandwiched between the pole tips of the first and second pole piece layers and forming a portion of the ABS;
      a read head including:
         a magnetic tunnel junction (MTJ) sensor, the MTJ sensor being sandwiched between first and second shield layer, the MTJ sensor comprising:
            a pinned layer;
            a ferromagnetic free layer;
            a tunnel barrier layer sandwiched between raid pinned layer and said free layer;
            a ferromagnetic bias layer, said bias layer having a high uniaxial anisotropy caused by stressing said bias layer, wherein the ferromagnetic bias layer has a thickness in the range of 1.5–2 times the thickness of the free layer; and
            a spacer layer sandwiched between said free layer and said bias layer; and
         an insulation layer disposed between the second shield layer of the read head and the first pole piece layer of the write head; and an actuator for moving said magnetic read/write head across the magnetic disk so that the read/write head may access different regions of the magnetic recording disk; and a recording channel coupled electrically to the write head for magnetically recording data on the magnetic recording disk and to the MTJ sensor of the read head for detecting changes in resistance of the MTJ sensor in response to magnetic fields from the magnetically recorded data.

6. A disk drive system comprising:

a magnetic recording disk:

a magnetic read/write head for magnetically recording data on the magnetic recording disk and for sensing magnetically recorded data on the magnetic recording disk, said magnetic read/write head comprising:
  a write head including:
    at least one coil layer and an insulation stack, the coil layer being embedded in the insulation stack;
    first and second pole piece layers connected at a back gap and having pole tips with edges forming a portion of an air bearing surface (ABS);
    the insulation stack being sandwiched between the first and second pole piece layers; and
    a write gap layer sandwiched between the pole tips of the first and second pole piece layers and forming a portion of the ABS;
  a read head including:
    a spin valve (SV) sensor, the SV sensor being sandwiched between first and second shield layers, the SV sensor comprising:
      a pinned layer;
      a ferromagnetic free layer;
      a first spacer layer sandwiched between said pinned layer and said free layer;
      a ferromagnetic bias layer, said bias layer having a high uniaxial anisotropy caused by stressing said bias layer, wherein the ferromagnetic bias layer has a thickness in the range of 1.5–2 times the thickness of the free layer; and
      a second spacer layer sandwiched between said free layer and said bias layer; and
  an insulation layer disposed between the second shield layer of the read head and the first pole niece layer of the write head; and an actuator for moving said magnetic read/write head across the magnetic disk so that the read/write head may access different regions of the magnetic recording disk; and a recording channel coupled electrically to the write head for magnetically recording data on the magnetic recording disk and to the SV sensor of the read head for detecting changes in resistance of the SV sensor in response to magnetic fields from the magnetically recorded data.

* * * * *